(12) United States Patent
Dong (10) Patent No.: US 12,525,523 B2
(45) Date of Patent: Jan. 13, 2026

(54) DISPLAY PANEL AND DISPLAY DEVICE (71) Applicant: WUHAN CHINA STAR OPTOELECTRONICS TECHNOLOGY CO., LTD., Hubei (CN)

(72) Inventor: Shuya Dong, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 773 days.

(21) Appl. No.: 17/905,171

(22) PCT Filed: Jul. 29, 2022

(86) PCT No.: PCT/CN2022/109124
§ 371 (c)(1),
(2) Date: Aug. 28, 2022

(87) PCT Pub. No.: WO2024/021073
PCT Pub. Date: Feb. 1, 2024

(65) Prior Publication Data
US 2024/0203859 A1 Jun. 20, 2024

(30) Foreign Application Priority Data
Jul. 25, 2022 (CN) .......................... 202210875083.3

(51) Int. Cl.
H01L 23/498 (2006.01)
H05K 1/18 (2006.01)

(52) U.S. Cl.
CPC ........ *H01L 23/49838* (2013.01); *H05K 1/189* (2013.01); *H05K 2201/052* (2013.01); *H05K 2201/10128* (2013.01)

(58) Field of Classification Search
CPC .............. H01L 23/49838; H05K 1/189; H05K 2201/052; H05K 2201/10128
See application file for complete search history.

(56) References Cited

U.S. PATENT DOCUMENTS

| | | | |
|---|---|---|---|
| 5,404,239 A * | 4/1995 | Hirai | H05K 3/363 174/254 |
| 7,791,704 B2 * | 9/2010 | Abe | G02F 1/13452 349/158 |

(Continued)

FOREIGN PATENT DOCUMENTS

| | | |
|---|---|---|
| CN | 101285942 A | 10/2008 |
| CN | 101901568 A | 12/2010 |

(Continued)

OTHER PUBLICATIONS

International Search Report in International application No. PCT/CN2022/109124,mailed on Jan. 4, 2023.

(Continued)

*Primary Examiner* — Cheng Yuan Tseng
(74) *Attorney, Agent, or Firm* — PV IP PC; Peter S. Stecher; Wei Te Chung (57) ABSTRACT A display panel and a display device are provided, wherein a terminal region of the display panel includes a first terminal region, a second terminal region, and a third terminal region. The display panel includes a plurality of first terminals and a second terminal, each of the plurality of first terminals is located in the first terminal region and close to the second terminal region, and the second terminal is located in the second terminal region and electrically connected to the first terminal by a first trace. A length direction of the first terminal extends through the second terminal region, and the first trace is located between the first terminal region and the second terminal region.

20 Claims, 4 Drawing Sheets (56) References Cited

U.S. PATENT DOCUMENTS

| | | | | |
|---|---|---|---|---|
| 8,102,349 | B2* | 1/2012 | Ashizawa | G02F 1/1345 |
| | | | | 349/149 |
| 8,446,556 | B2* | 5/2013 | Kawamura | H05K 3/0052 |
| | | | | 349/149 |
| 9,232,634 | B2* | 1/2016 | Uehara | H05K 1/056 |
| 9,992,862 | B2* | 6/2018 | Shin | G02B 6/0011 |
| 10,057,978 | B2* | 8/2018 | Ono | G09F 9/00 |
| 10,283,064 | B2* | 5/2019 | Chen | G09G 3/3666 |
| 10,897,819 | B2* | 1/2021 | Wu | H05K 3/361 |
| 10,963,080 | B2* | 3/2021 | Lee | G06F 1/1626 |
| 11,217,131 | B2* | 1/2022 | Xia | H05K 1/0281 |
| 11,360,628 | B2* | 6/2022 | Li | G06F 3/0443 |
| 11,500,432 | B2* | 11/2022 | Shin | G02F 1/13458 |
| 11,659,666 | B2* | 5/2023 | Wu | H05K 1/147 |
| | | | | 361/749 |
| 11,948,396 | B2* | 4/2024 | Wang | H05K 1/189 |
| 12,038,639 | B2* | 7/2024 | Oh | G02F 1/133354 |
| 12,183,758 | B2* | 12/2024 | Miyamoto | H10F 39/802 |
| 2018/0338377 | A1* | 11/2018 | Zuo | H05K 1/117 |
| 2020/0355972 | A1 | 11/2020 | Jian et al. | |
| 2024/0203859 | A1* | 6/2024 | Dong | H01L 23/49838 |

FOREIGN PATENT DOCUMENTS

| | | |
|---|---|---|
| CN | 105204248 A | 12/2015 |
| CN | 105372891 A | 3/2016 |
| CN | 105653087 A | 6/2016 |
| CN | 106681067 A | 5/2017 |
| CN | 109634003 A | 4/2019 |
| CN | 110012592 A | 7/2019 |
| CN | 110018598 A | 7/2019 |
| CN | 110707097 A | 1/2020 |
| CN | 111399290 A | 7/2020 |
| CN | 111933030 A | 11/2020 |
| CN | 112086015 A | 12/2020 |
| EP | 0994565 A2 | 4/2000 |
| JP | 2001337341 A | 12/2001 |
| JP | 2008058730 A | 3/2008 |
| WO | 2020248722 A1 | 12/2020 |
| WO | 2021204071 A1 | 10/2021 |
| WO | 2022000619 A1 | 1/2022 |

OTHER PUBLICATIONS

Written Opinion of the International Search Authority in International application No. PCT/CN2022/109124, mailed on Jan. 4, 2023.
Chinese Office Action issued in corresponding Chinese Patent Application No. 202210875083.3 dated Apr. 20, 2023, pp. 1-7.
Chinese Notice of Allowance issued in corresponding Chinese Patent Application No. 202210875083.3 dated Jun. 12, 2023, pp. 1-5.

* cited by examiner

DISPLAY PANEL AND DISPLAY DEVICE

TECHNICAL FIELD

The present application relates to a field of display technology, and more particularly, to a display panel and a display device.

BACKGROUND

Narrow bezel technology has been developed as a major in a display field owe to its higher display ratio and better visual experience. To reduce a lower frame of a display panel, the conventional display panel proposes a technical solution in which flexible printed circuit (FPC) terminals are provided on sides of the integrated circuit (IC) terminals, respectively, and the FPC terminals and the IC terminals are connected by bent traces.

However, the longer length of the bent trace, the greater impedance, which affects signal transmission.

Technical Problem

The present application provides a display panel that shortens a length of a trace between an IC terminal and an FPC terminal by adjusting an arrangement of the FPC terminals, thereby reducing an impedance between the IC terminal and the FPC terminal.

SUMMARY

The present application provides a display panel including a display area and a terminal area disposed outside the display area, wherein the terminal area includes a first terminal region, a second terminal region, and a third terminal region, the first terminal region and the third terminal region are located on opposite sides of the second terminal region;

wherein the display panel includes a plurality of first terminals and a second terminal, each of the plurality of first terminals is located in the first terminal region and close to the second terminal region, and the second terminal is located in the second terminal region and electrically connected to the first terminal by a first trace, wherein an extension line of the first terminal in a length direction extends through the second terminal region, and the first trace is located between the first terminal region and the second terminal region.

Optionally, in some embodiments of the present application, the second terminal is located correspondingly on the extension line of the first terminal in the length direction.

Optionally, in some embodiments of the present application, the first terminal includes a connecting end, and the connecting end is disposed on a side of the first terminal close to the second terminal region and connects with the first trace.

Optionally, in some embodiments of the present application, the display panel further includes a plurality of third terminals located in the first terminal region and away from the second terminal region, wherein a length direction of a part of the plurality of third terminals is parallel to a length direction of the plurality of first terminals, and a length direction of another part of the plurality of third terminals is perpendicular to the length direction of the plurality of first terminals.

Optionally, in some embodiments of the present application, the display panel further includes a fourth terminal located in the second terminal region, and the fourth terminal is electrically connected to at least one of the plurality of third terminals by a second trace.

Optionally, in some embodiments of the present application, each of the plurality of third terminals is electrically connected to the second terminal by the first terminal.

Optionally, in some embodiments of the present application, the display panel further includes a fifth terminal located in the first terminal region and close to the second terminal region, and a sixth terminal located in the second terminal region and electrically connected to the fifth terminal by a third trace, and a length direction of the fifth terminal is perpendicular to the length direction of the plurality of first terminals.

Optionally, in some embodiments of the present application, the fifth terminal is located on at least one of: a side of the first terminal close to the display area,
a side of the first terminal away from the display area, and
a position between two of the plurality of first terminals.

Optionally, in some embodiments of the present application, the third trace is located between the first terminal region and the second terminal region.

Optionally, in some embodiments of the present application, the display panel further includes a plurality of seventh terminals and an eighth terminal, each of the plurality of seventh terminals is located in the third terminal region and close to the second terminal region, and the eighth terminal is located in the second terminal region and electrically connected to the seventh terminal by a fourth trace, wherein the fourth trace is located between the third terminal region and the second terminal region.

Optionally, in some embodiments of the present application, the seventh terminal and the first terminal are symmetrically disposed relative to the second terminal region.

Optionally, in some embodiments of the present application, the fourth trace and the first trace are symmetrically disposed relative to the second terminal region.

Optionally, in some embodiments of the present application, the display panel further includes a plurality of ninth terminals located in the third terminal region and away from the second terminal region, wherein a length direction of a part of the plurality of ninth terminals is parallel to a length direction of the plurality of seventh terminals, and a length direction of another part of the plurality of ninth terminals is perpendicular to the length direction of the plurality of seventh terminals.

Optionally, in some embodiments of the present application, the display panel further includes a tenth terminal located in the second terminal region, and the tenth terminal is electrically connected to at least one of the plurality of ninth terminals by a fifth trace.

Optionally, in some embodiments of the present application, the display panel further includes an eleventh terminal located in the third terminal region and close to the second terminal region, and a twelfth terminal located in the second terminal region and electrically connected to the eleventh terminal by a sixth trace, wherein a length direction of the eleventh terminal is perpendicular to a length direction of the eighth terminal.

Optionally, in some embodiments of the present application, the first trace includes a straight portion, a first end portion, and a second end portion, wherein the first end portion connects the straight portion with at least one of the plurality of first terminals, the second end portion connects the straight portion with at least one of the plurality of second terminals; and the straight part is correspondingly disposed on an extension line of at least one of the plurality of first terminals in a length direction.

Optionally, in some embodiments of the present application, a width of the straight portion is greater than or equal to a width of the first end portion, and the width of the straight portion is greater than a width of the second end portion.

Optionally, in some embodiments of the present application, the display panel includes a plurality of the first traces, and a width of straight portions of at least two of the first traces is different.

Optionally, in some embodiments of the present application, the display panel further includes an integrated circuit chip and a flexible printed circuit, wherein the flexible printed circuit includes a body section, a first connection section and a second connection section, and the first connection section and the second connection section are disposed on opposite sides of the body section, and wherein the first connection section is correspondingly disposed to the first terminal region, the second connection section is correspondingly disposed to the second terminal region, and the integrated circuit chip is bond to the second terminal region of the display panel.

The present application further provides a display device including the display panel according to any one of the embodiments of the present application.

The present application provides a display panel and a display device.

BENEFICIAL EFFECT

The present application provides a display panel, a binding device, and a display device. By providing a first terminal close to a second terminal region as opposed to the second terminal region, a first trace connecting the first terminal and the second terminal is provided in the first terminal region and the second terminal region, so that a length of the first trace is reduced, a resistance of the first trace is reduced, a voltage drop between the FPC terminal and the IC terminal is reduced, and a display effect of the display panel is improved.

BRIEF DESCRIPTION OF THE DRAWINGS

The technical solution and other beneficial effects of the present application will be apparent from the following detailed description of specific embodiments thereof, taken in conjunction with the accompanying drawings.

DETAILED DESCRIPTION OF THE EMBODIMENTS

The present application provides a display panel to reduce a resistance of a conventional flexible display panel has due to an excessive trace between an IC terminal and an FPC terminal.

In an embodiment, references are made to FIGS. 1 to 6, wherein FIGS. 1 to 4 respectively show four schematic structural diagrams of a display panel according to an embodiment of the present application. As shown in FIGS. 1 to 6, an embodiment of the present application provides a display panel including a display area 101, and a terminal area 102 disposed outside the display area 101, wherein the terminal area 102 includes a first terminal region 103, a and a third terminal region 105, and the first terminal region 103 and the third terminal region 105 are located on opposite sides of the second terminal region 104.

The display panel includes a plurality of first terminals 11 and a second terminal 12, wherein each of the plurality of first terminals is located in the first terminal region 103 and close to the second terminal region 104, the second terminal 12 is located in the second terminal region 104 and electrically connected to the first terminals 11 by a first trace 31. An extension line of the first terminal 11 in a length direction extends through the second terminal region 104. The first trace 31 is located between the first terminal region 103 and the second terminal region 104.

Figure 5:
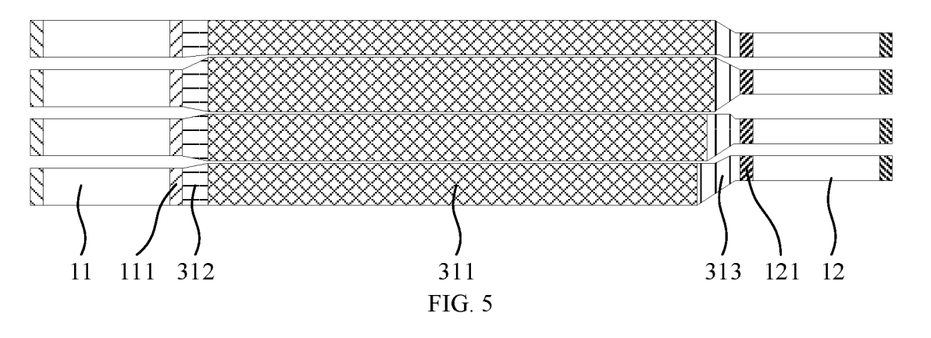
FIG. 5 is an enlarged structural diagram of region 106 in FIG. 1 and region 107 in FIG. 2.
Figure 6:
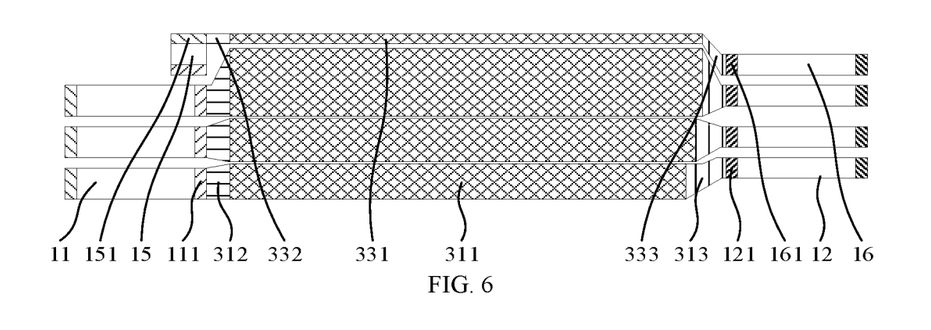
FIG. 6 is an enlarged structural diagram of region 108 in FIG. 3 and region 109 in FIG. 4.

The first terminal 11 includes first connecting ends 111 provided on opposite sides of the first terminal. Referring to FIG. 5 and FIG. 6, a length direction of the first terminal 11 is consistent with a direction along which two first connecting ends 111 are opposite to each other. In an embodiment of the present application, the first terminal region 103 and the third terminal region 105 are FPC terminal regions, and the terminals in the first terminal region 103 and the terminal in the third terminal region 105 are FPC terminals. The second terminal region 104 is an IC terminal region, and the terminal in the second terminal region 104 is an IC terminal.

According to an embodiment of the present application, the first terminal close to the second terminal region is disposed opposite to the second terminal, so that the first trace connecting the first terminal and the second terminal is disposed between the first terminal region and the second terminal region, thereby reducing the length of the first trace, reducing the resistance of the first trace, reducing the voltage drop between the FPC terminal and the IC terminal, and improving the display effect of the display panel. Meanwhile, the length of the trace is reduced, and the width of the trace can be appropriately reduced with satisfying the resistance requirement, thereby reducing a space in a width direction occupied by the trace, and facilitating the realization of a narrow frame for the display panel.

Embodiment 1

Figure 1:
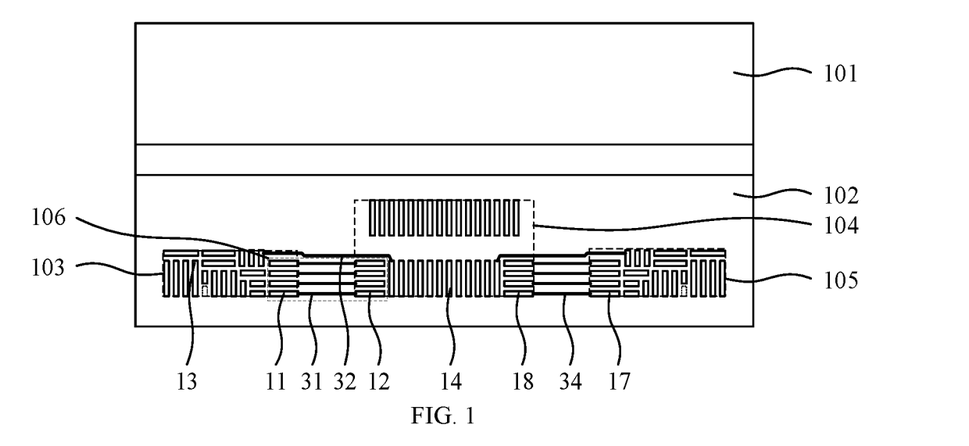
FIG. 1 is a first schematic structural diagram of a display panel according to an embodiment of the present application.

Referring to FIG. 1, the second terminal region 104 is generally disposed at an intermediate position of the terminal area 102. In the second terminal region 104, the display panel includes an upper terminal (a terminal close to the display area 101) and a lower terminal (a terminal away from the display area 101). The upper terminal is electrically connected to a circuit in the display area, and the lower terminal is electrically connected to a terminal in the first terminal region 103 or the third terminal region 105. The lower terminal includes a plurality of second terminals 12 and a plurality of fourth terminals 14, wherein the second terminals 12 are located on a side of the second terminal region 104 close to the first terminal region 103. In an embodiment, a extension line of the second terminal 12 in a length direction extends through the first terminal region 103. Further, the second terminal 12 is located correspondingly on the extension line of the first terminal 11 in the length direction.

The first terminal region 103 and the third terminal region 105 are located on opposite sides of the second terminal region 104. Lines connecting among the first terminal region 103, the second terminal region 104 and the third terminal region 105 are parallel to the display area 101. In the first terminal region 103, the display panel includes a plurality of first terminals 11 located on a side of the first terminal region 103 close to the second terminal region 104, and a plurality of third terminals 13 located on a side of the first terminal region 103 away from the second terminal region 104. The extension line of each of the plurality of first terminals 11 in the length direction extends through the second terminal region 104. The first terminal 11 and the second terminal 12 are electrically connected by the first trace 31, and the first trace 31 is located in the first terminal region 103 and the second terminal region 104.

The plurality of third terminals 13 are located on a side of the first terminal 11 away from the second terminal region 104. The length direction of a part of the third terminals 13 is parallel to the length direction of the first terminal 11, and the length direction of a part of third terminals 13 is perpendicular to the length direction of the first terminal 11. At least one of the third terminals 13 is electrically connected to the fourth terminal 14 by a second trace 32. The second trace 32 connects the third terminal 13 with the fourth terminal 14, and extends through a side of first terminal 11 close to the display area 101 and a side of first trace 31 close to the display area 101. When the fourth terminal 14 is located on a side of the second terminal 12 away from the first terminal region 103, the second trace 32 also extends through a side of the second terminal 12 close to the display area 101. Further, a shape of the second trace 32 is shown as a fold line in FIG. 1.

Reference is made to FIG. 5, wherein FIG. 5 is an enlarged structural diagram of region 106 in FIG. 1. Specifically, FIG. 5 shows an enlarged structural diagram of the first terminal 11, the first trace 31, and the second terminal 12. The first terminal 11 includes two first connecting ends 111 disposed oppositely. One of the two first connecting ends 111 is located on a side of the first terminal 11 close to the second terminal region 104, and the other one of the two first connecting ends 111 is located on a side of the first terminal 11 away from the second terminal region 104. The second terminal 12 includes two second connecting ends 121 disposed oppositely. One of the two second connecting ends 121 is located on a side of the second terminal 12 close to the first terminal region 103, and the other one of the two second connecting ends 121 is located on a side away from the first terminal region 103. The first trace 31 includes a straight portion 311, a first end portion 312 and a second portion 313, wherein the first end portion 321 is connected to the straight portion 311 and the first connecting end 111 close to the second terminal region 104, and the second end portion 313 is connected to the straight portion 311 and the second connecting end 121 close to the first terminal region 103.

The straight portion 311 is located correspondingly on the extension line of the first terminal 11 in the length direction, a width of the straight portion 311 is greater than or equal to a width of the first end portion 312, and the width of the straight portion 311 is greater than a width of the second end portion 313. A width of a portion of the first end portion 312 close to the first connecting end 111 is less than a width of a portion of the first end portion 312 close to the straight portion 311. A shape of the first end portion 312 may be a trapezoidal shape as shown in FIG. 5. A width of a portion of the second end portion 313 close to the second connecting end 121 is less than a width of the portion of the second end portion 313 close to the straight portion 311. A shape of the second end portion 313 may be trapezoidal as shown in FIG. 5, or may be other irregular shapes. The first end portion 312 may be specifically designed according to the first terminal 11 and the straight portion 311 correspondingly, and the second end portion 313 may be specifically designed according to the second terminal 12 and the straight portion 311 correspondingly. Further, the second terminal 12 is located correspondingly on the extension line of the first terminal 11 in the length direction, so that the first trace 31 is straight.

The length of the straight portion 311 of each of the first traces 31 may be the same, or the lengths of the straight portions 311 of at least two of the first traces 31 may be different. Accordingly, the length of the second end portion 313 of each of the first traces 31 may be the same, or the lengths of the second end portions 313 of at least two of the first traces 31 may be different. The width of the straight portion 311 of each of the first traces 31 may be the same, or the widths of the straight portions 311 of at least two of the first traces 31 may be different. The straight portion 311 of the first trace 31 reduces the overall resistance of the first trace 31, thereby reducing the voltage drop between the first terminal 11 and the second terminal 12, and improving the display effect of the display panel. Therefore, the first terminal 11 and the second terminal 12 may be provided as signal terminals corresponding to signal transmission traces with a requirement on low resistance. The first trace 31 correspondingly transmits a corresponding signal, for example, a proportional VSS signal, a AVSS signal, a VDDI signal, a V-com signal, a AVDD signal, and the like. The width of the straight portion 311 has a great influence on the resistance of the first trace 31, and the width of the straight portion 311 of the first trace 31 can be specifically designed according to the resistance requirement of the first trace 31 for the electric signal transmitted on the first trace 31. For example, the width of the straight portion 311 of the first trace 31 transmitting the VDDI signal is set greater.

Embodiment 2

Figure 2:
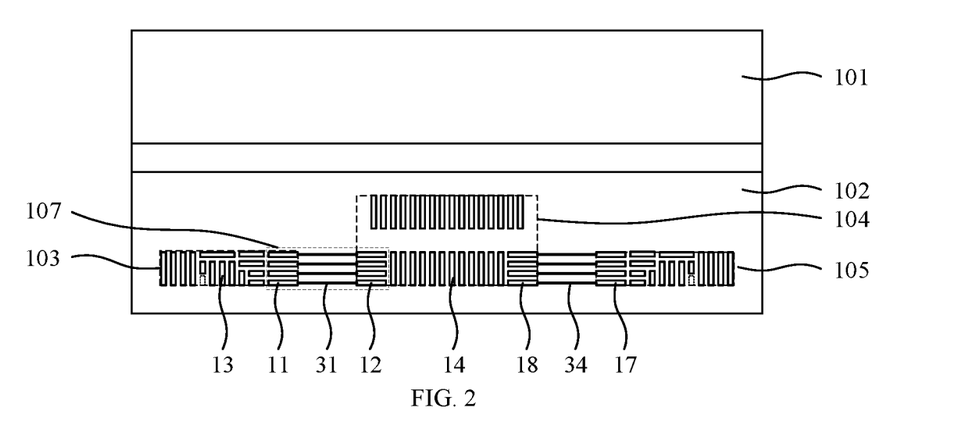
FIG. 2 is a second schematic structural diagram of a display panel according to an embodiment of the present application.

Referring to FIG. 2, the basic structure of the display panel according to this embodiment is substantially similar to the basic structure of the display panel according to the above embodiment, and details are not described herein. The differences between these embodiments lie in: in Embodiment 2, all of the third terminals 13 are electrically connected to the second terminals 12 by the first terminals 11, respectively. That is, the display panel includes only the first trace 31, and does not include the second trace 32. Compared with the Embodiment 1, the first trace 31 of Embodiment 2 replaces the second trace 32 of Embodiment 1 to further shorten the length of the trace between the FPC terminal and the IC terminal, thereby reducing the voltage drop between the FPC terminal and the IC terminal, and improving the display effect of the display panel.

Embodiment 3

Figure 3:
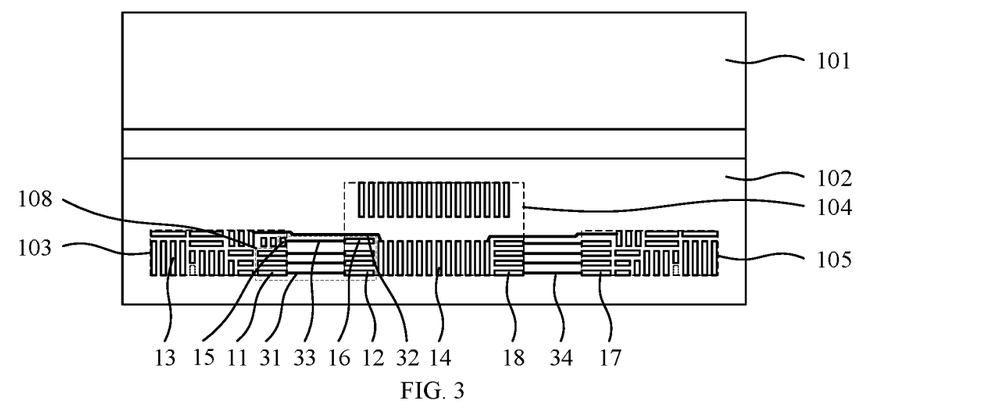
FIG. 3 is a third schematic structural diagram of a display panel according to an embodiment of the present application.

Referring to FIG. 3, the basic structure of the display panel according to this embodiment is substantially similar to the basic structure of the display panel according to the above embodiment, and details are not described herein. The differences between these embodiments lie in: in Embodiment 3, the display panel further includes a fifth terminal 15, a sixth terminal 16, and a third trace 33, wherein the fifth terminal 15 is located in the first terminal region 103 and close to the second terminal region 104, and the sixth terminal 16 is located in the second terminal region 104 and electrically connected to the fifth terminal 15 by the third trace 33. The length direction of the fifth terminal 15 is perpendicular to the length direction of the first terminal 11. The fifth terminal 15 is located on a side of the first terminal 11 close to the display area 101; alternatively, the fifth terminal 15 is located on a side of the first terminal 11 away from the display area 101; alternatively, the fifth terminal 15 is located between the two first terminals 11. When the sixth terminal 16 is located on a side of the second terminal region 104 close to the first terminal region 103, the third trace 33 is located between the first terminal region 103 and the second terminal region 104, as shown in FIG. 3. When the sixth terminal 16 is located on a side of the second terminal 12 away from the first terminal region 103, the third trace 33 extends through a side of the first trace 31 close to the display area 101 and a side of the second terminal 12 close to the display area 101.

Referring to FIG. 6, FIG. 6 is an enlarged schematic structural diagram of region 108 in FIG. 3. Specifically, FIG. 6 shows an enlarged schematic structural diagram of the first terminal 11, the first trace 31, the second terminal 12, the fifth terminal 15, the sixth terminal 16, and the third trace 33. Similarly, the fifth terminal 15 includes two fifth connecting ends 151 disposed oppositely, wherein one of the two fifth connecting ends 151 is located on a side of the fifth terminal 15 close to the display area 101, and the other one of the two fifth connecting ends 151 is located on a side of the fifth terminal 15 away from the display area 101. The sixth terminal 16 includes two sixth connecting ends 161 disposed oppositely, wherein one of the two sixth connecting ends 161 is located on a side of the two sixth terminals 16 close to the first terminal region 103, and the other one of the two sixth connecting ends 161 is located on a side of the sixth terminal 16 away from the first terminal region 103. Similarly, the third trace 33 includes a straight portion 331, a first end portion 332, and a second end portion 333, wherein the first end portion 332 is connected to the straight portion 331 and the fifth connecting end 151 close to the display area 101, and the second end portion 333 is connected to the straight portion 311 and the sixth connecting end 161 close to the first terminal region 103. The straight portion 331 of the third trace 33 also reduces the overall resistance of the third trace 33, thereby reducing the voltage drop between the fifth terminal 15 and the sixth terminal 16, and improving the display effect of the display panel.

The width of the straight portion 331 may be the same as or greater than the width of the first end portion 332. The width of the straight portion 331 may be the same as or greater than the width of the second end portion 333. The width of the straight portion 331 is less than or equal to the length of the fifth terminal 15. Similarly, the shapes of the first end portion 332 and the second end portion 333 may be rectangular, trapezoidal, or other irregular polygonal shape, and the shapes may be specifically designed according to the straight portion 331, the fifth connecting end 151, and the sixth connecting end 161. The straight portion 331 of the third trace 33 is located on a side of the straight portion 311 of the first trace 31 close to the display area 101. In this way, the straight portion 311 of the first trace 31 can be further widened to an area between the fifth terminal 15 and the six terminals 16, and the resistance of the first trace 31 can be further reduced, thereby satisfying the need of a specific signal for the signal trace with low resistance, and further improving the display effect of the display panel.

Embodiment 4

Figure 4:
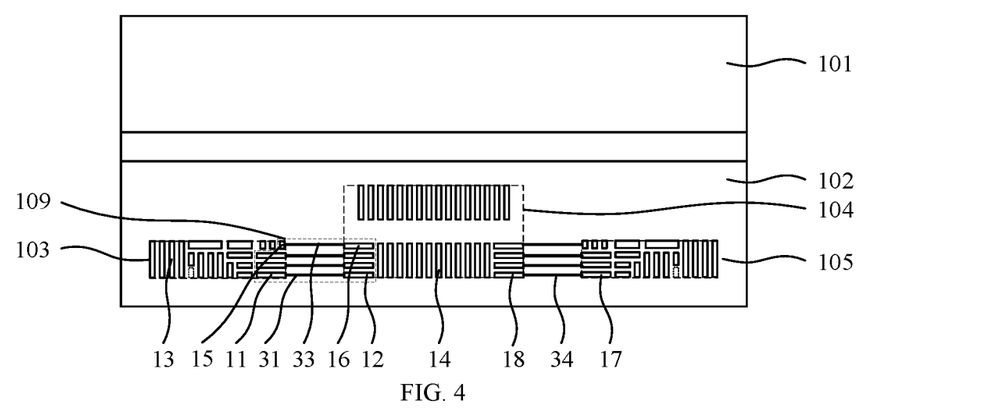
FIG. 4 is a fourth schematic structural diagram of a display panel according to an embodiment of the present application.

Referring to FIG. 4, the basic structure of the display panel according to this embodiment is substantially similar to basic structure of the display panel according to the above embodiments, and details are not described herein. The differences between these embodiments lie in: in Embodiment 4, a part of the third terminals 13 is electrically connected to the second terminal 12 by the first terminal 11, and a remaining part of the third terminals 13 is electrically connected to the sixth terminal 16 by the fifth terminal 15. That is, the display panel includes only the first trace 31 and the third trace 33, and does not include the second trace 32. Compared with Embodiment 3, the Embodiment 4 further shortens the length of the trace between the FPC terminal and the IC terminal, reduces the voltage drop between the FPC terminal and the IC terminal, and improve the display effect of the display panel.

Further, for any one of the Embodiments 1 to 4 above, the display panel further includes a plurality of seventh terminals 17 and an eighth terminals 18, wherein each of the plurality of seventh terminals 17 is located in the third terminal region 105 and close to the second terminal region 104, and the eighth terminals 18 is located in the second terminal region 104 and electrically connected to the seventh terminal 17 by a fourth trace 34. The fourth trace 34 is located between the third terminal region 105 and the second terminal region 104. The seventh terminal 17 is provided in a manner similar to that of the first terminal 11, the eighth terminal 18 is provided in a manner similar to that of the second terminal 12, and the fourth trace 34 is provided in a manner similar to that of the first trace. For details, references may be made to the above-described embodiment.

Further, the display panel may further include a plurality of ninth terminals located in the third terminal region 105 and away from the second terminal region 104, and the ninth terminal is provided in a manner similar to that of the third terminal 13. The display panel may also include a tenth terminal located in the second terminal region 104, and the tenth terminal is provided in a manner similar to that of the fourth terminal 14. The display panel further includes an eleventh terminal located in the third terminal region 105 and close to the second terminal region 104, and a twelfth terminal located in the second terminal region, wherein the eleventh terminal is provided in a manner similar to that of the fifth terminal 15, and the twelfth terminal is provided in a manner similar to that of the sixth terminal 16. The display panel may further include a fifth trace and a sixth trace, the fifth trace and the sixth trace are provided in a manner similar to these of the second trace and the third trace, respectively. Specifically, reference may be made to the above-described embodiments.

Preferably, the terminals in the third terminal region 105 and the terminals in the first terminal region 103 are symmetrically disposed relative to the second terminal region 104.

Figure 7:
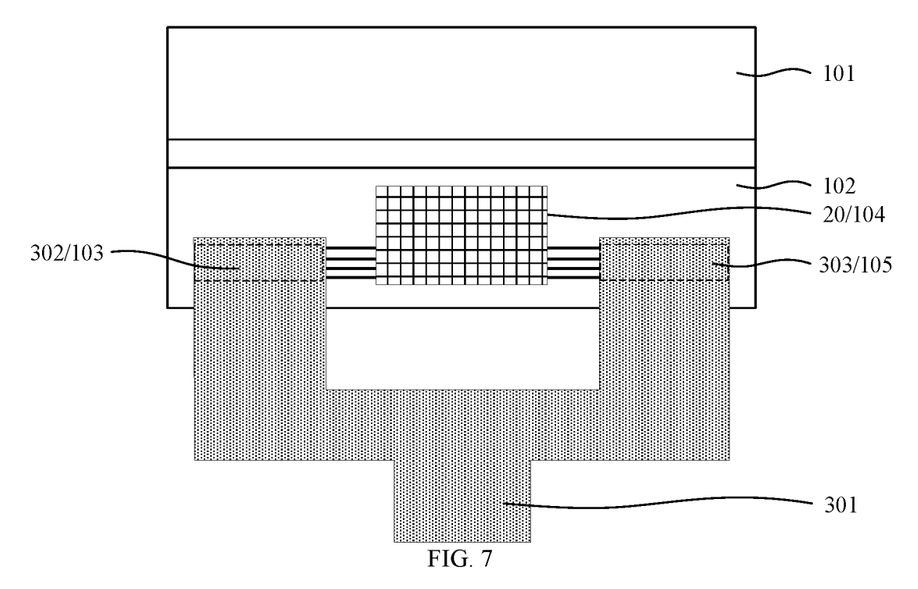
FIG. 7 is a fifth schematic structural diagram of a display panel according to an embodiment of the present application.

Referring to FIG. 7, FIG. 7 is a fifth schematic structural diagram of a display panel according to an embodiment of the present application. The display panel further includes an integrated circuit chip 20 and a flexible printed circuit, wherein the flexible printed circuit includes a body section

301, a first connection section 302 and a second connection section 303. The first connection section 302 and the second connection section 303 are disposed on opposite sides of the body section 301. The first connection section 302 is correspondingly disposed to the first terminal region 103, and the second connection section 303 is correspondingly disposed to the second terminal region 105. The integrated circuit chip 20 is bond to the second terminal region 104 of the display panel.

Meanwhile, the embodiment of the present application further provides a display device including the display panel according to any one of the embodiments of the present application. Therefore, the display device includes the technical features and advantageous effects of the display panel according to any one of the embodiments of the present application. For details, refer to the above embodiments, which are not repeated herein again.

Embodiments of the present application provides a display panel and a display device, in which a first terminal close to a second terminal region is disposed opposite to the second terminal region, so that a first trace connecting the first terminal and the second terminal is disposed in the first terminal region and the second terminal region, thereby reducing a length of the first trace, reducing a resistance of the first trace, reducing a voltage drop between the FPC terminal and the IC terminal, and improving a display effect of the display panel. Meanwhile, the length of the trace is reduced. The width of the trace can be appropriately reduced with satisfying the resistance requirement, thereby reducing the space in a width direction occupied by the trace and facilitating the realization of a narrow frame for the display panel.

Although the present application has been disclosed in the above preferred embodiments, the above preferred embodiments are not intended to limit the present application, and those of ordinary skill in the art may make various changes and modifications without departing from the spirit and scope of the present application, and therefore the scope of protection of the present application is as defined in the claims.

What is claimed is:

1. A display panel, comprising a display area, and a terminal area disposed outside the display area; wherein the terminal area comprises a first terminal region, a second terminal region, and a third terminal region, the first terminal region and the third terminal region are located on opposite sides of the second terminal region;

wherein the display panel comprises a plurality of first terminals and a second terminal, each of the plurality of first terminals is located in the first terminal region and close to the second terminal region, and the second terminal is located in the second terminal region and electrically connected to the first terminal by a first trace, wherein an extension line of the first terminal in a length direction extends through the second terminal region, and the first trace is located between the first terminal region and the second terminal region;

wherein the display panel further comprises a plurality of third terminals located in the first terminal region and away from the second terminal region, wherein a length direction of a part of the plurality of third terminals is parallel to a length direction of the plurality of first terminals, and a length direction of another part of the plurality of third terminals is perpendicular to the length direction of the plurality of first terminals;

wherein each of the plurality of third terminals is electrically connected to the second terminal by the first terminal.

2. The display panel of claim 1, wherein the second terminal is located correspondingly on the extension line of the first terminal in the length direction.

3. The display panel of claim 2, wherein the first terminal comprises a connecting end, and the connecting end is disposed on a side of the first terminal close to the second terminal region and connects with the first trace.

4. The display panel of claim 1, wherein the display panel further comprises a fourth terminal located in the second terminal region, and the fourth terminal is electrically connected to at least one of the plurality of third terminals by a second trace.

5. The display panel of claim 1, wherein the display panel further comprises a fifth terminal located in the first terminal region and close to the second terminal region, and a sixth terminal located in the second terminal region and electrically connected to the fifth terminal by a third trace, and a length direction of the fifth terminal is perpendicular to the length direction of the plurality of first terminals.

6. The display panel of claim 5, wherein the fifth terminal is located on at least one of: a side of the first terminal close to the display area, a side of the first terminal away from the display area, and a position between two of the plurality of first terminals.

7. The display panel of claim 5, wherein the third trace is located between the first terminal region and the second terminal region.

8. The display panel of claim 1, wherein the display panel further comprises a plurality of seventh terminals and an eighth terminal, each of the plurality of seventh terminals is located in the third terminal region and close to the second terminal region, and the eighth terminal is located in the second terminal region and electrically connected to the seventh terminal by a fourth trace, wherein the fourth trace is located between the third terminal region and the second terminal region.

9. The display panel of claim 8, wherein the seventh terminal and the first terminal are symmetrically disposed relative to the second terminal region.

10. The display panel of claim 9, wherein the fourth trace and the first trace are symmetrically disposed relative to the second terminal region.

11. The display panel of claim 8, wherein the display panel further comprises a plurality of ninth terminals located in the third terminal region and away from the second terminal region, wherein a length direction of a part of the plurality of ninth terminals is parallel to a length direction of the plurality of seventh terminals, and a length direction of another part of the plurality of ninth terminals is perpendicular to the length direction of the plurality of seventh terminals.

12. The display panel of claim 11, wherein the display panel further comprises a tenth terminal located in the second terminal region, and the tenth terminal is electrically connected to at least one of the plurality of ninth terminals by a fifth trace.

13. The display panel of claim 11, wherein the display panel further comprises an eleventh terminal located in the third terminal region and close to the second terminal region, and a twelfth terminal located in the second terminal region and electrically connected to the eleventh terminal by a sixth trace, wherein a length direction of the eleventh terminal is perpendicular to a length direction of the eighth terminal.

14. The display panel of claim 1, wherein the first trace includes a straight portion, a first end portion, and a second end portion, wherein the first end portion connects the straight portion with at least one of the plurality of first terminals, the second end portion connects the straight portion with at least one of the plurality of second terminals; and the straight part is correspondingly disposed on an extension line of at least one of the plurality of first terminals in a length direction.

15. The display panel of claim 14, wherein a width of the straight portion is greater than or equal to a width of the first end portion, and the width of the straight portion is greater than a width of the second end portion.

16. The display panel of claim 14, wherein the display panel comprises a plurality of the first traces, and a width of straight portions of at least two of the first traces is different.

17. The display panel of claim 1, wherein the display panel further comprises an integrated circuit chip and a flexible printed circuit, wherein the flexible printed circuit comprises a body section, a first connection section and a second connection section, and the first connection section and the second connection section are disposed on opposite sides of the body section, and wherein the first connection section is correspondingly disposed to the first terminal region, the second connection section is correspondingly disposed to the second terminal region, and the integrated circuit chip is bond to the second terminal region of the display panel.

18. A display device, comprising the display panel of claim 1.

19. A display panel, comprising a display area, and a terminal area disposed outside the display area; wherein the terminal area comprises a first terminal region, a second terminal region, and a third terminal region, the first terminal region and the third terminal region are located on opposite sides of the second terminal region;
   wherein the display panel comprises a plurality of first terminals and a second terminal, each of the plurality of first terminals is located in the first terminal region and close to the second terminal region, and the second terminal is located in the second terminal region and electrically connected to the first terminal by a first trace, wherein an extension line of the first terminal in a length direction extends through the second terminal region, and the first trace is located between the first terminal region and the second terminal region;
   wherein the first trace includes a straight portion, a first end portion, and a second end portion, wherein the first end portion connects the straight portion with at least one of the plurality of first terminals, the second end portion connects the straight portion with at least one of the plurality of second terminals; and the straight part is correspondingly disposed on an extension line of at least one of the plurality of first terminals in a length direction;
   wherein a width of the straight portion is greater than or equal to a width of the first end portion, and the width of the straight portion is greater than a width of the second end portion.

20. A display panel, comprising a display area, and a terminal area disposed outside the display area; wherein the terminal area comprises a first terminal region, a second terminal region, and a third terminal region, the first terminal region and the third terminal region are located on opposite sides of the second terminal region;
   wherein the display panel comprises a plurality of first terminals and a second terminal, each of the plurality of first terminals is located in the first terminal region and close to the second terminal region, and the second terminal is located in the second terminal region and electrically connected to the first terminal by a first trace, wherein an extension line of the first terminal in a length direction extends through the second terminal region, and the first trace is located between the first terminal region and the second terminal region;
   wherein the first trace includes a straight portion, a first end portion, and a second end portion, wherein the first end portion connects the straight portion with at least one of the plurality of first terminals, the second end portion connects the straight portion with at least one of the plurality of second terminals; and the straight part is correspondingly disposed on an extension line of at least one of the plurality of first terminals in a length direction;
   wherein the display panel comprises a plurality of the first traces, and a width of straight portions of at least two of the first traces is different.

* * * * *